United States Patent [19]

Boudreau

[11] Patent Number: 5,528,826
[45] Date of Patent: Jun. 25, 1996

[54] METHOD OF CONSTRUCTING HIGH YIELD, FINE LINE, MULTILAYER PRINTED WIRING BOARD PANEL

[75] Inventor: Paul Boudreau, Hermosa Beach, Calif.

[73] Assignee: Hughes Aircraft Company, Los Angeles, Calif.

[21] Appl. No.: 223,089

[22] Filed: Apr. 4, 1994

[51] Int. Cl.$^6$ .................................................. H05K 3/36
[52] U.S. Cl. .................... 29/830; 29/831; 29/402.08; 174/250
[58] Field of Search ................... 29/830, 831, 402.08; 174/250

[56] References Cited

U.S. PATENT DOCUMENTS

| | | | |
|---|---|---|---|
| 4,338,149 | 7/1982 | Quaschner | 29/831 |
| 4,820,171 | 4/1989 | Korteqaard | 29/831 |
| 4,961,806 | 10/1990 | Gerrie et al. | 29/831 |
| 5,321,884 | 6/1994 | Ameen et al. | 29/830 |

FOREIGN PATENT DOCUMENTS 4-101498  4/1992  Japan ........................................ 29/830

*Primary Examiner*—P. W. Echols
*Attorney, Agent, or Firm*—Leonard A. Alkov; Wanda K. Denson-Low

[57] ABSTRACT

In the handling of printed wiring board innerlayer panels which have a thin copper-clad substrate, the protective foil layer is retained thereon to aid in stiffening the panel during processing up to the final stacking for multilayer lamination. At an intermediate step, the circuit patterns are inspected and defective patterns are replaced by operative patterns during the stacking process prior to multilayer lamination.

6 Claims, 4 Drawing Sheets

METHOD OF CONSTRUCTING HIGH YIELD, FINE LINE, MULTILAYER PRINTED WIRING BOARD PANEL

FIELD OF THE INVENTION

Printed wiring board innerlayer panels have a plurality of separate circuit patterns formed thereon. Individual defective patterns are replaced in the innerlayer panel prior to multilayer lamination. When the panel is very thin, it is provided with a protective metal foil which remains in place on the panel around the circuit patterns during innerlayer processing to provide sufficient strength for panel manipulation.

BACKGROUND OF THE INVENTION

Panels which will be formed into printed wiring boards are comprised of a dielectric substrate, usually of filled synthetic polymer composition material. The panels have a thin metal foil laminated on one or both sides, which will be etched to form circuit patterns. The circuit patterns are usually small compared to the panel, but for convenience of handling and cost, a plurality of circuit patterns are formed on each panel, commonly called a multi-up panel.

Multi-up patterns are panels where a plurality of circuit patterns are processed together on the same panel. These circuit patterns may be related or unrelated and are not electrically connected to each other. The reason a plurality of circuit patterns is incorporated in one panel is purely from an economic handling viewpoint. If a plurality of circuit patterns can be processed at the same time, the number of handling steps per pattern is reduced. When circuit patterns are small compared to the panel size, the use of a multi-up arrangement is economically successful. Each of the circuit patterns represents a printed wiring board when it is ultimately cut out of the panel.

As the panels are processed, some of the circuit patterns may become defective. Such is particularly true when the circuit pattern is formed with very narrow conductors and spaces. In the past, this has resulted in the rejection of the entire innerlayer panel or the creation of one or more multilayer printed wiring boards on a multi-up panel with an inoperative layer therein. It is particularly difficult to handle the panels between processing steps when the substrate and the copper foil thereon are particularly thin.

SUMMARY OF THE INVENTION

In order to aid in the understanding of this invention, it can be stated in summary form that it is directed to a method for constructing multi-up, multilayer panels by replacing individual defective innerlayer circuit patterns which have thin substrates and thin film thereon for the creation of the printed wiring. Replaceability is achieved by providing circuit patterns with locating holes and replacing defective circuit patterns with operative circuit patterns including securing the operative circuit patterns in place in the panel. The panel may additionally or alternatively be handled by leaving thereon protective metal foil around the circuit patterns during innerlayer processing to provide more strength to the panel.

The purposes and advantages of this invention will become apparent from a study of the following portion of the specification, the claims and the attached drawings wherein:

DESCRIPTION OF THE PREFERRED EMBODIMENT

Figure 2:
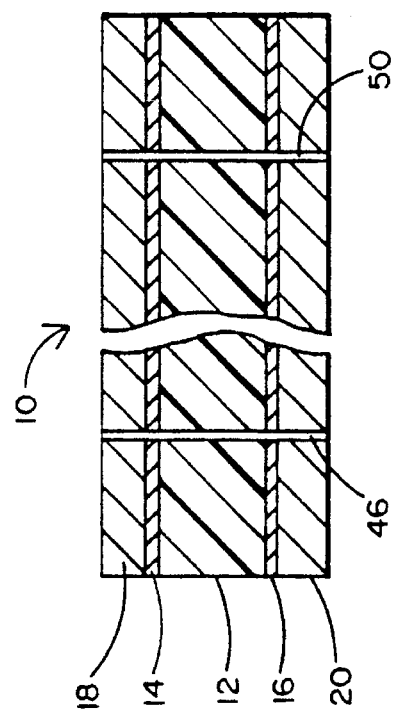
FIG. 2 is an enlarged section taken generally along line 2—2 of FIG. 1, with parts broken away.

Printed wiring board panel 10 is generally indicated in FIGS. 1, 2, 3, 4, 5, 6, 7, 8 and 9. The printed wiring board panel has a dielectric substrate 12, seen in FIGS. 2, 4 and 5. The dielectric substrate is any one of the common dielectric substrates employed in printed wiring board structures. They are usually thermoplastic or thermosetting polymer composition material and is preferably such a material which has great dimensional stability when subjected to the various processes required for the printed wiring board. Fiberglass-filled polyimide is suitable. When multilayer printed wiring boards are being produced, the thickness of the substrate should be reduced to minimize the total thickness of the final multilayer printed wiring board. In modern practice, the substrate can be as thin as 0.0025 inch (0.064 mm).

When a multilayer printed wiring board is to be produced, it is most convenient to provide a printed wiring circuit on each side of the substrate. Thus, in the preferred embodiment, copper film layers 14 and 16 are laminated on the upper and lower surfaces of the substrate. In modern practice where very high density circuitry is required, these copper film layers are of minimum thickness. In the industry, the thickness of the copper foil is measured in ounces per square foot. In the type of printed wiring board of the preferred example, the thickness of the copper film layers 14 and 16 are as small as ⅛ ounce of copper foil per square foot (39 grams per square meter), which equates to a copper foil thickness of 0.0002 inch (0.0044 millimeters). Such a printed wiring board has poor rigidity, is quite limp, and is very difficult to handle in processing. As supplied by the manufacturers, such a panel carries thereon protective foil layers 18 and 20. These protective foil layers are made of copper or aluminum and have a thickness of about 0.003 inch (0.075 millimeters). The protective layers are intended by the manufacturer to merely serve as protection during shipping and handling before printed wiring board processing.

In processing, the first step is to punch or drill registration holes into the panel. Panel registration holes 22, 24, 26 and 28 are shown to be adjacent the corners of the panel 10 and are employed for the purpose of position reference with respect to details on the entire panel. In addition, circuit panel registration holes are positioned adjacent each circuit pattern to be placed on the panel. Presuming that there are three circuit patterns to be placed on the panel 10, three sets of circuit pattern registration holes are placed in the panel 10. The first set of circuit pattern registration holes comprises the holes 30, 32, 34 and 36. The second set of circuit pattern registration holes comprises the holes 38, 40, 42 and 44. The third set of circuit pattern registration holes comprises the holes 46, 48, 50 and 52. The circuit pattern registration holes are positioned as physical reference to particular circuit patterns which will be etched into the circuit film layer on the substrate, and thus are adjacent this later positioning of the circuit pattern. While four registration holes are described as suitable for positioning the panel 10, more or less holes may be employed depending upon the size of the panel and its flexibility. Similarly, while four circuit pattern registration holes are described with respect to each potential circuit pattern, more or less may be employed.

Figure 4:
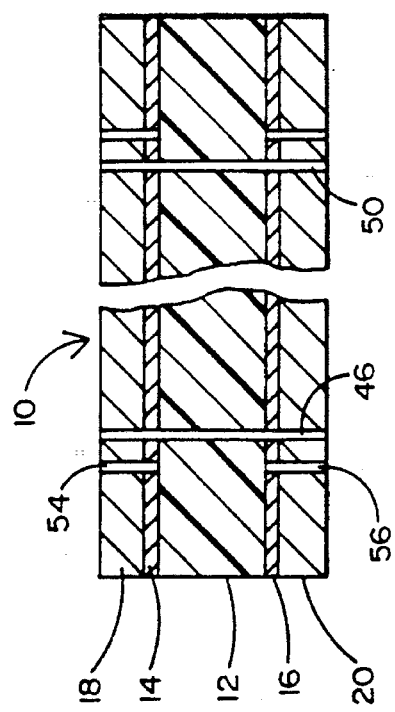
FIG. 4 is an enlarged section taken generally along line 4—4 of FIG. 3, with parts broken away.
Figure 1:
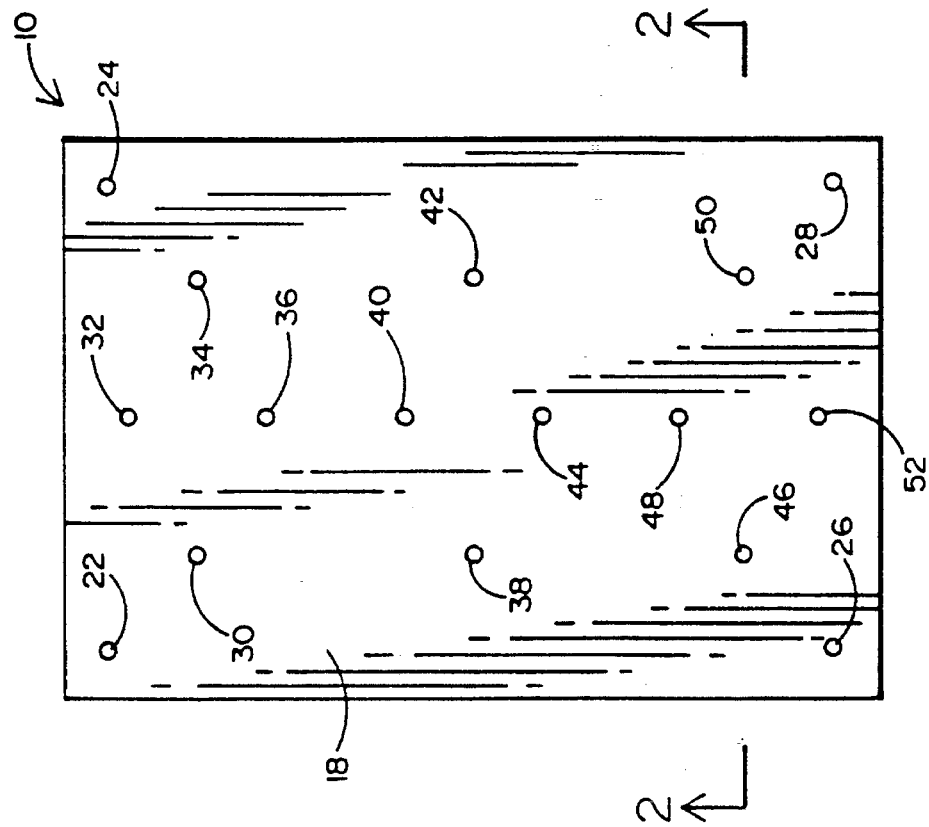
FIG. 1 is a plan view of a circuit panel at the beginning of the method of constructing in accordance with this invention.
Figure 5:
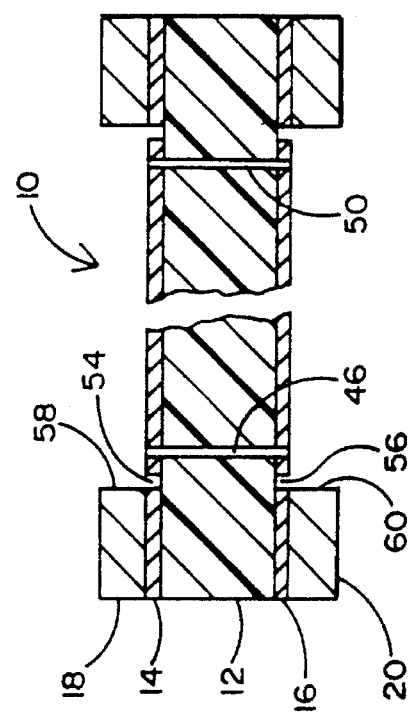
FIG. 5 is similar to FIG. 4 with the protective layer removed inside its peripheral cut lines.
Figure 3:
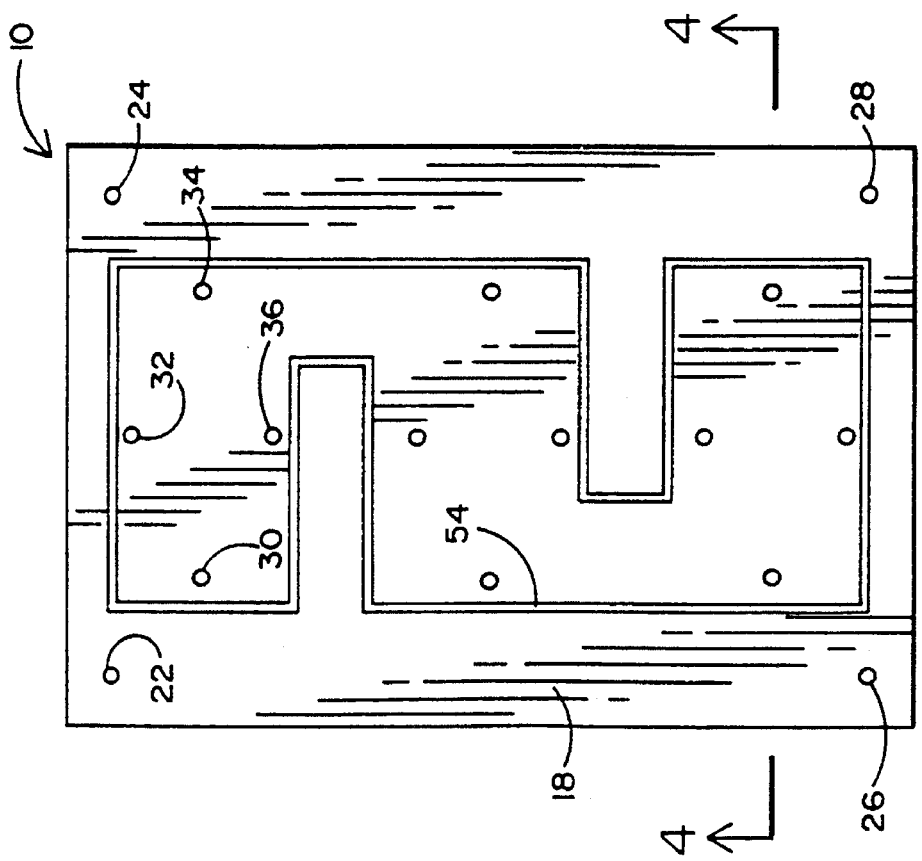
FIG. 3 is a plan view of the panel after the protective layer cutting step.

After the placing of the registration holes, both the protective foil layer and the copper film layers are etched through in a pattern which outlines the position of the circuit patterns which are to be formed later and lies within the panel registration holes. Etched grooves 54 and 56 are seen in FIG. 4 where they etch through both the film layer and the protective foil layer. They are seen in FIG. 5 where they cut through the copper film layer. Grooves 54 are seen in the FIG. 3 plan view. The outer walls of these grooves are indicated at 58 and 60 in FIG. 5. The etching of the grooves is accomplished by any convenient means, such as photoresist and chemical etching.

Figure 6:
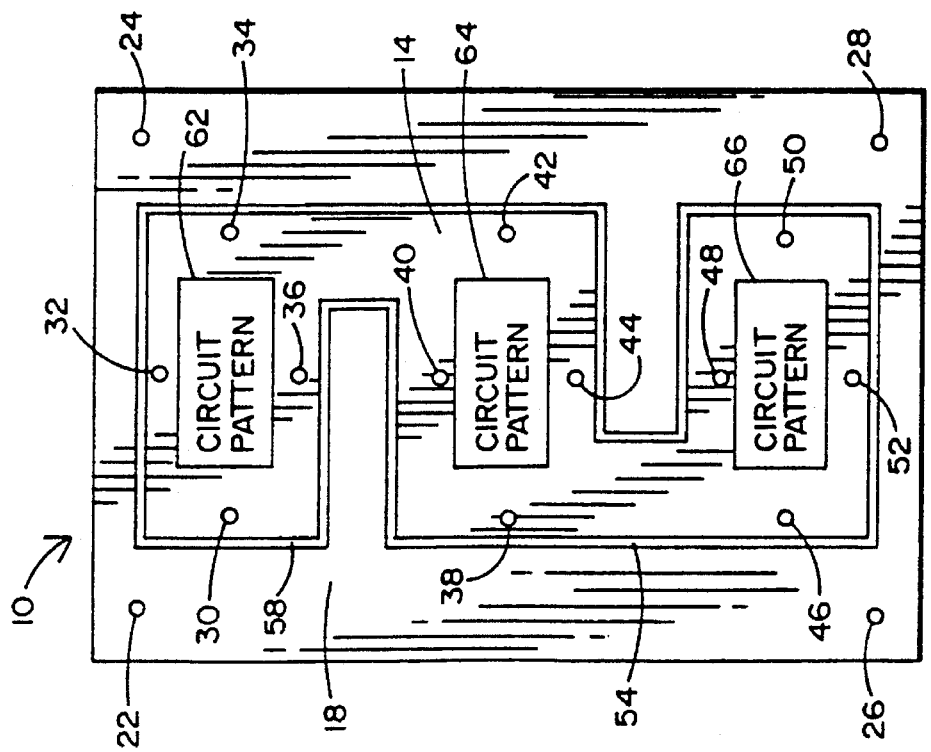
FIG. 6 is a plan view of the panel showing printed wiring in patterns thereon.

After the etched grooves 54 and 56 are formed, the protective foil layers within the outlines of the etched groove are removed from both sides to expose the copper film layers into which the circuit patterns will be etched. It is this point in the process which is illustrated in FIGS. 5 and 6. When the printed wiring panel is passed through the usual photoresist-exposure-develop-etching process, circuit patterns are created. Circuit patterns 62, 64 and 66 are shown in FIG. 6. As previously discussed, there may be more or less such circuit patterns on the panel, but each such circuit pattern is associated with its own group of circuit pattern registration holes, as indicated in FIG. 6. Furthermore, the circuit patterns 62, 64 and 66 may be identical to each other or may be different.

In high density printed wiring board, the printed wiring is small and the spacing there-between is small in order to achieve high density. In modern-day photo-etching processes, printed wiring lines as small as 0.003 inch (0.075 millimeters) and spaces as small as 0.003 inch (0.075 millimeters) are achieved. A problem with this very fine-line printed wiring board structure is that it is difficult to make the printed wiring board circuit pattern free of defects. The yield of an innerlayer panel with many such fine line circuit patterns can be very low.

Figure 7:
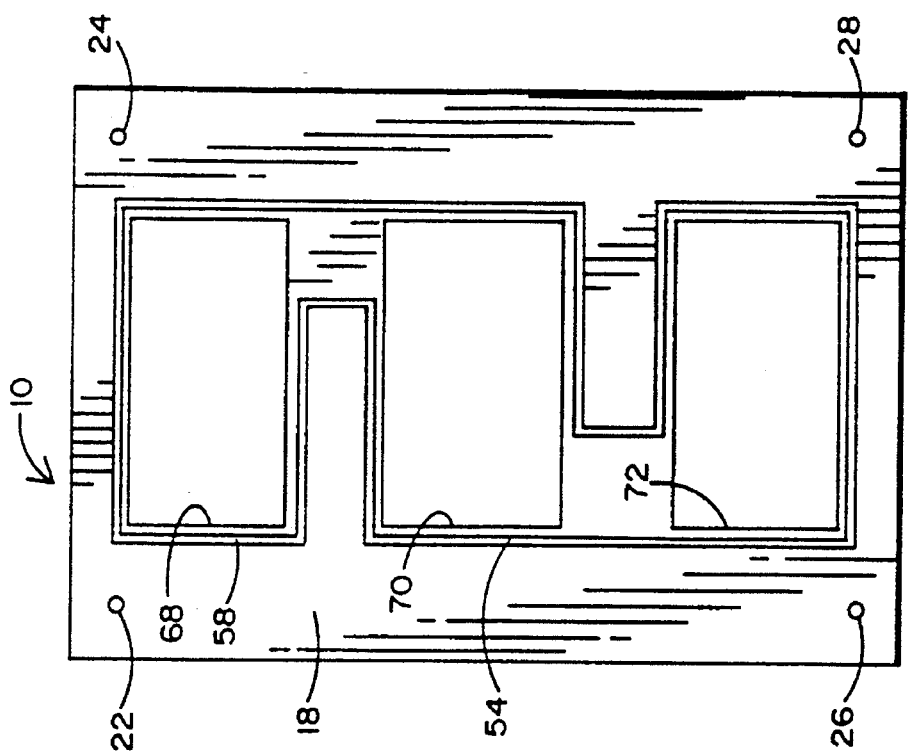
FIG. 7 is similar to FIG. 6, but showing all of the circuit patterns cut out.
Figure 8:
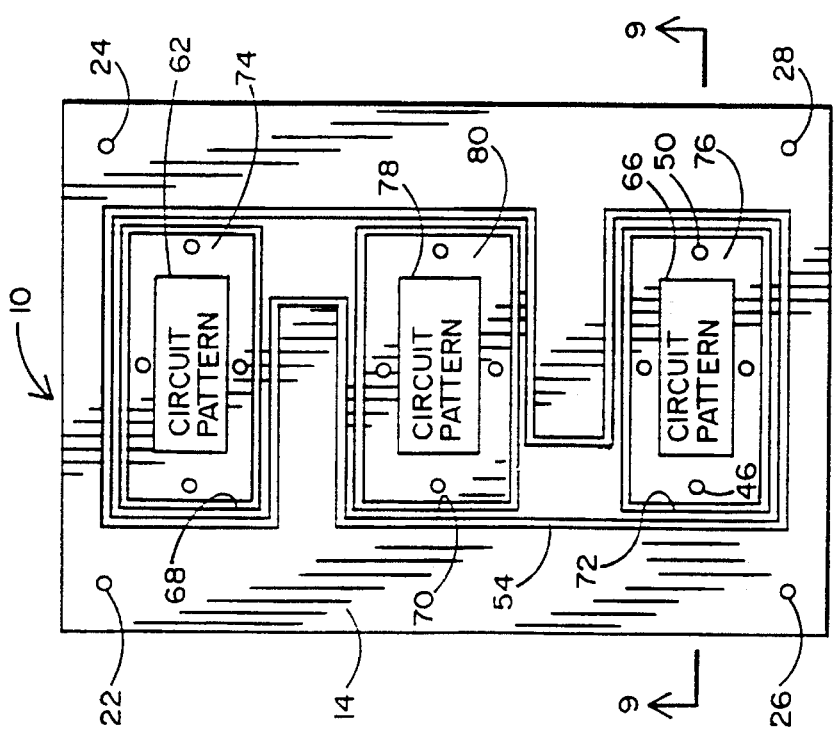
FIG. 8 is similar to FIG. 7 showing the panel with all operative circuit patterns replaced into the panel frame by means of tooling holes and pins located in the lamination plates and circuit patterns. The protective layer is removed so that the panel is ready for laminating with a plurality of other panels to create a plurality of multilayer printed wiring boards.

Each of the circuit patterns is inspected electrically or visually to determine whether or not it is correct. Short circuits between printed wiring which are intended to be separate result in rejected circuit patterns. Similarly, open spaces in printed wiring which is intended to be continuous also result in inoperative circuits and must be rejected. Each of the circuit patterns is tested; the inoperative circuit patterns are identified; and the operative circuit patterns are identified. Either before or after the inspection, circuit patterns 62, 64 and 66 are all cut out of the innerlayer panel 10 to leave three frame openings 68, 70 and 72, as seen in FIG. 7. Next, operative circuit patterns are replaced into the frame openings. One or more may be fabricated to obtain sufficient operative circuit patterns. As seen in FIG. 8, circuit pattern 62 on its carrier 74 is replaced into frame opening 68 because the circuit pattern 62 has been found to be operative. Similarly, circuit pattern 66 on its carrier 76 is replaced into frame opening 72 because the circuit pattern 66 has been found to be operative. However, as an example, circuit pattern 78 on its carrier 80 is placed into the frame opening 70 because the previous circuit pattern 68 has been found to be inoperative. The circuit pattern 78 came from a different, but similar source. Thus, all of the circuit patterns in printed wiring board panel 10 shown in FIG. 8 have been inspected, and those found to have been inoperative have been replaced. When all of the circuit patterns are removed and replaced, then the positioning of the patterns is more uniform rather than have the replaced ones setting in adhesive and the originally good ones still in the original panel. This is superior to just cutting out the faulty ones and replacing only the faulty circuits.

Figure 9:
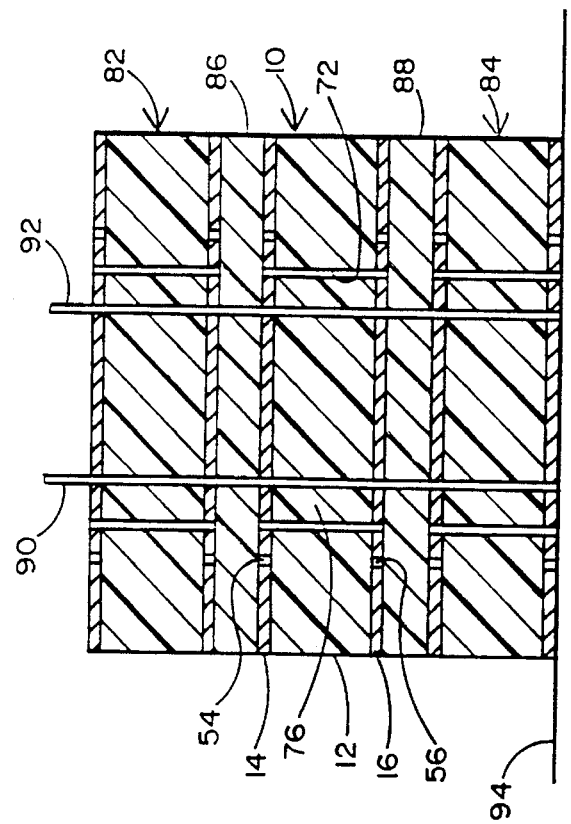
FIG. 9 is a section through a stack of printed wiring board panels ready for lamination.

A plurality of these printed wiring board panels, each with a plurality of operative circuit patterns is then assembled into multiple layer configuration. The first step is to remove the protective foil therearound the periphery of the circuit patterns. Next, the printed wiring panels and the individual circuit patterns are assembled on guide pins through their registration holes. The assembly of these panels into a multiple layer structure includes the positioning of a pre-impregnated dielectric laminate formed of thermoplastic material filled with fiber, such as polyimide-impregnated fiberglass. FIG. 9 shows a stack of three panels 12, 82 and 84, each similar to panel 10, assembled on the circuit pattern registration holes and with the pre-impregnated layers 86 and 88 positioned therebetween. Full panel size sheets of the pre-impregnated dielectric are used to bond the layers of the frames and the circuit patterns to form a multi-up multilayer panel. Guide pins 90 and 92, mounted on press base 94, locate through guide pin holes 46 and 50 in carrier 76 and through the similar holes in the stacked assembly. Pressure on the stack causes the pre-impregnated layers 86 and 88 to fill into the spaces between the frames and carriers and make the panels whole again.

Since each circuit pattern is independent of the printed wiring board panel frame and is positioned by its own registration holes, dimensional changes during lamination of each circuit pattern into a multilayer panel are similar and are related to the circuit pattern registration holes rather than the printed wiring board panel registration holes. After the pressure and thermal processing of the stack of printed wiring board panels, the multilayer structure is solid and completed. Subsequent processing is conventional with the drilling through for vias and the connection of circuits by electroless copper deposition processes followed by electrolytic plating operations. The multilayer boards are cut from their multilayer panels.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. The method of constructing a multilayer printed wiring board comprising:

providing a printed wiring board panel comprised of a substrate having upper and lower sides and a metal film layer on each of the upper and lower sides;

forming panel registration holes through the panel and forming circuit pattern registration holes through the panel adjacent positions where a circuit pattern will be formed;

etching circuit patterns in the metal film layer on at least one side of the substrate at the circuit pattern positions;

inspecting the circuit patterns to determine whether they meet circuit standards;

routing out at least those circuit patterns and their respective circuit panel registration holes which do not meet circuit requirements;

replacing the routed-out circuit patterns and their adjacent circuit pattern registration holes with circuit patterns which do meet the circuit requirements;

registering the replacing circuit pattern with its circuit pattern registration holes; and laminating a plurality of the printed wiring board panels together with dielectric adhesive therebetween while holding the circuit patterns which do meet the circuit requirements in position with guide pins within the circuit pattern registration holes so that a multilayer printed wiring board panel with replaced circuit patterns is created.

2. The method of claim 1 wherein a plurality of circuit patterns is etched on each metal film layer.

3. The method of claim 1 wherein a plurality of circuit patterns is etched on each side of at least some of the printed wiring board panels.

4. The method of claim 2 wherein all of the circuit patterns are routed out with each having its circuit pattern registration holes therewith and all of the circuit patterns are replaced with operative circuit patterns so that all of the replacing circuit patterns are held in place with their guide pin within registration holes during the laminating step.

5. The method of claim 4 wherein a plurality of circuit patterns is etched on each side of at least some of the printed wiring board panels.

6. The method of claim 5 wherein the printed wiring board is initially provided with a protective foil layer on its metal film layer on both its upper and lower sides and as a step before the circuit pattern etching step, the protective foil layer around the circuit pattern positions and around the circuit pattern registration holes is removed.

* * * * *